United States Patent
Park

(10) Patent No.: US 7,869,291 B2
(45) Date of Patent: Jan. 11, 2011

(54) PRECHARGE VOLTAGE SUPPLY CIRCUIT AND SEMICONDUCTOR DEVICE USING THE SAME

(75) Inventor: Sang Il Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 7 days.

(21) Appl. No.: 12/459,064

(22) Filed: Jun. 26, 2009

(65) Prior Publication Data

US 2009/0268536 A1    Oct. 29, 2009

Related U.S. Application Data

(62) Division of application No. 11/824,841, filed on Jun. 29, 2007, now Pat. No. 7,570,528.

(30) Foreign Application Priority Data

Dec. 29, 2006  (KR) ............... 10-2006-0138797

(51) Int. Cl.
    *G11G 7/00* (2006.01)
(52) U.S. Cl. .............. 365/203; 365/226; 365/104
(58) Field of Classification Search .......... 365/203, 365/226, 104, 185.23, 185.05, 189.09, 156
    See application file for complete search history.

(56) References Cited

U.S. PATENT DOCUMENTS

| 5,638,262 | A |   | 6/1997  | Brown |
| 5,982,349 | A | * | 11/1999 | Yoon ........................... 345/98 |
| 2007/0263451 | A1 | * | 11/2007 | Lee ........................ 365/185.22 |
| 2008/0159033 | A1 |   | 7/2008  | Park |

* cited by examiner

*Primary Examiner*—Dang T Nguyen
(74) *Attorney, Agent, or Firm*—John P. White; Cooper & Dunham LLP

(57) ABSTRACT

A precharge voltage supply circuit and a semiconductor device using the same are disclosed. The semiconductor device includes a first comparator for comparing a precharge voltage with a first reference voltage having a first voltage level and outputting a first compare signal as a result of the comparison, a second comparator for comparing the precharge voltage with a second reference voltage having a second voltage level and outputting a second compare signal as a result of the comparison, a decoder configured to receive and decode the first compare signal and the second compare signal and output a plurality of control signals as a result of the decoding, and a precharge voltage supply circuit configured to receive the plurality of control signals and supply the precharge voltage.

11 Claims, 6 Drawing Sheets

PRECHARGE VOLTAGE SUPPLY CIRCUIT AND SEMICONDUCTOR DEVICE USING THE SAME

This application is a divisional of U.S. Ser. No. 11/824,841, filed Jun. 29, 2007 now U.S. Pat. No. 7,570,528, which claims priority of Korean Patent Application No. 10-2006-0138797, filed Dec. 29, 2006, the contents of which are hereby incorporated by reference into this application.

BACKGROUND

The present disclosure relates to a precharge voltage supply circuit and a semiconductor device using the same, and more particularly to a precharge voltage supply circuit which is capable of, in a power down mode, reducing the amount of leakage current flowing through a bridge-formed region and supplying a precharge voltage of a proper level, so as to suppress generation of logically erroneous bits.

Recently, with a higher integration of semiconductor devices, each part of the semiconductor devices has been gradually reduced in occupied area thereof. Particularly, in a dynamic random access memory (DRAM) semiconductor device, the pitch of gates in the semiconductor device has been reduced, resulting in an increased possibility that a bridge will be formed between a word line and a bit line in a manufacturing process of the semiconductor device. The formation of the bridge between the word line and the bit line mainly results from gate residue, namely, polysilicon not completely removed after etching of a polysilicon film to form a gate, or undesirable removal of a nitride film on the gate during a chemical mechanical polishing (CMP) process, causing weakness of the corresponding region.

FIG. 1 is a sectional view illustrating the formation of a bridge between a word line and a bit line in a semiconductor device. As shown in FIG. 1, when a bridge is formed between a word line and a bit line, a current path is established between the word line and the bit line. As a result, charges in the bit line flow along the current path in a power down mode of the semiconductor device, resulting in generation of undesirable leakage current between the word line and the bit line in the power down mode. Of course, it may be possible to replace a failed cell, in which the bridge is formed, with a redundant cell. In this case, however, the failed cell still remains in the semiconductor device, so that leakage current still flows through the failed cell.

FIG. 2 is a graph illustrating the amount of leakage current generated due to failures in rows/columns caused by a bridge between a word line and a bit line. Referring to FIG. 2, it can be seen that the amount of leakage current is increased in proportion to the number of failed rows/columns caused by failed cells. The leakage current unnecessarily consumed per failed cell is about 9 μA, which corresponds to 7 to 10% of a limit value specified in Standard Specification for standby current in low-power semiconductor devices. The increase in leakage current caused by a bridge formed between a word line and a bit line adversely affects the current characteristics of the semiconductor device. Consequently, such a leakage current increase serves as a major factor degrading the throughput of the semiconductor device.

Of course, in order to reduce leakage current caused by failed cells in a semiconductor device, a method of adding a high resistance component to a precharge voltage supply circuit in the semiconductor device to achieve a reduction in leakage current may be conceived. However, although this method may reduce leakage current somewhat, there is a problem in that it is impossible to avoid logical errors which may occur due to various resistance components resulting from the formation of a bridge between a bit line and a word line.

In other words, a resistance component in a current path between a bit line and a word line, established due to the formation of a bridge between the bit line and the word line, has various values depending on various factors, such as the type of a semiconductor device and a position and frequency at which it is generated. Provided that the resistance value in the current path is very low, a voltage applied to the inside of a DRAM cell will become excessively low due to a high resistance component installed in the precharge voltage supply circuit, thus making it impossible to maintain a precharge voltage at a proper level, leading to generation of bits with logical errors.

BRIEF SUMMARY

In an aspect of the present disclosure, a semiconductor device comprises a first comparator for comparing a precharge voltage with a first reference voltage having a first voltage level and outputting a first compare signal as a result of the comparison, a second comparator for comparing the precharge voltage with a second reference voltage having a second voltage level and outputting a second compare signal as a result of the comparison, a decoder configured to receive and decode the first compare signal and the second compare signal and output a plurality of control signals as a result of the decoding, and a precharge voltage supply circuit configured to receive the plurality of control signals and supply the precharge voltage.

Preferably, the precharge voltage supply circuit comprises a first switch for supplying the precharge voltage to an output terminal in response to a mode control signal in a normal mode, a second switch connected in parallel with the first switch, the second switch being turned on to supply the precharge voltage to the output terminal, when the precharge voltage is higher than the first reference voltage in a power down mode, and a third switch connected in parallel with the first switch, the third switch being turned on to supply the precharge voltage to the output terminal, when the precharge voltage is lower than the first reference voltage in the power down mode, wherein the second switch has a turn-on resistance higher than that of the third switch.

Preferably, the precharge voltage supply circuit further comprises a fourth switch connected in parallel with the first switch, the fourth switch being turned on to supply the precharge voltage to the output terminal, when the precharge voltage is lower than the second reference voltage in the power down mode, wherein the second reference voltage is lower than the first reference voltage, and the fourth switch has a turn-on resistance lower than that of the third switch.

The mode control signal may be enabled in the power down mode and disabled in the normal mode.

The plurality of control signals outputted from the decoder may include first to third control signals, wherein the second switch is operated in response to the first control signal, the third switch is operated in response to the second control signal and the fourth switch is operated in response to the third control signal, the first control signal is enabled when the precharge voltage is higher than the first reference voltage, the second control signal is enabled when the precharge voltage is lower than the first reference voltage and higher than the second reference voltage, and the third control signal is enabled when the precharge voltage is lower than the second reference voltage.

Preferably, the decoder comprises a first buffer for buffering the first compare signal and outputting the buffered signal as the first control signal a second buffer for buffering the second compare signal and outputting the buffered signal as the third control signal and a logic device for performing a logic operation with respect to the first control signal and the third control signal and outputting the second control signal as a result of the logic operation.

The second buffer may be an inverting buffer.

The logic device may perform a NAND operation.

Preferably, the first comparator comprises a first current mirror-type amplifier for outputting the first compare signal by comparing the precharge voltage with the first reference voltage and amplifying a difference there between, and first switching means for on/off-controlling the first current mirror-type amplifier in response to a predetermined internal voltage, and the second comparator comprises a second current mirror-type amplifier for outputting the second compare signal by comparing the precharge voltage with the second reference voltage and amplifying a difference there between, and second switching means for on/off-controlling the second current mirror-type amplifier in response to the predetermined internal voltage.

The first switching means may be installed between the first current mirror-type amplifier and a ground voltage terminal, and the second switching means may be installed between the second current mirror-type amplifier and the ground voltage terminal.

Preferably, the first current mirror-type amplifier comprises first pull-down means operated in response to the first reference voltage and installed between the first switching means and a first node, second pull-down means operated in response to the precharge voltage and installed between the first switching means and a second node, first pull-up means operated in response to a voltage at the first node and installed between the first node and an external voltage terminal, and second pull-up means operated in response to the voltage at the first node and installed between the second node and the external voltage terminal.

Preferably, the second current mirror-type amplifier comprises first pull-down means operated in response to the second reference voltage and installed between the second switching means and a first node, second pull-down means operated in response to the precharge voltage and installed between the second switching means and a second node; first pull-up means operated in response to a voltage at the first node and installed between the first node and an external voltage terminal, and second pull-up means operated in response to the voltage at the first node and installed between the second node and the external voltage terminal.

The first switch may be an NMOS device and the second to fourth switches may be PMOS devices.

Preferably, the semiconductor device further comprises a reference voltage generator for dividing a predetermined internal voltage to generate and output the first reference voltage and the second reference voltage.

Preferably, the reference voltage generator comprises a first resistor installed between an internal voltage supply terminal and a first node, a second resistor installed between the first node and a second node, and a third resistor installed between the second node and a ground voltage terminal, wherein the first reference voltage is an output voltage at the first node and the second reference voltage is an output voltage at the second node.

Alternatively, the reference voltage generator may comprise a first MOS diode and a first resistor installed in series between an internal voltage supply terminal and a first node, a second resistor installed between the first node and a second node, and a second MOS diode installed in series between the second node and a ground voltage terminal, wherein the first reference voltage is an output voltage at the first node and the second reference voltage is an output voltage at the second node.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE INVENTION

Preferred embodiments of the present invention will now be described in detail with reference to the accompanying drawings.

In a precharge voltage supply circuit and a semiconductor device using the same, according to the present invention, when a bridge is formed between a bit line and a word line associated with a specific cell in the semiconductor device, in a power down mode, the amount of leakage current flowing through a region where the bridge is formed is reduced, and precharge voltages of proper levels corresponding to various resistance values in a current path between the bit line and the word line established due to the bridge formation are supplied. Therefore, it is possible to suppress generation of logically erroneous bits.

Figure 1:
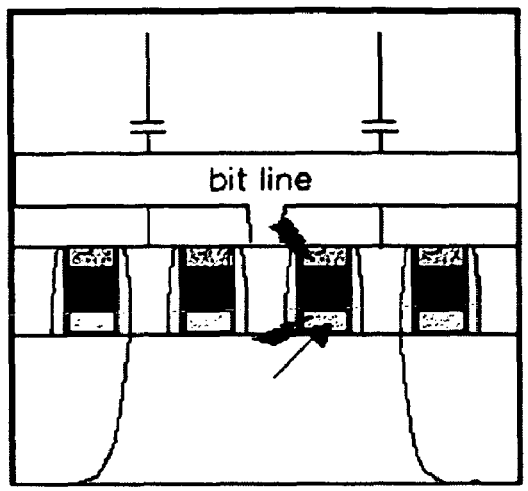
FIG. 1 is a sectional view illustrating the formation of a bridge between a word line and a bit line in a semiconductor device.
Figure 2:
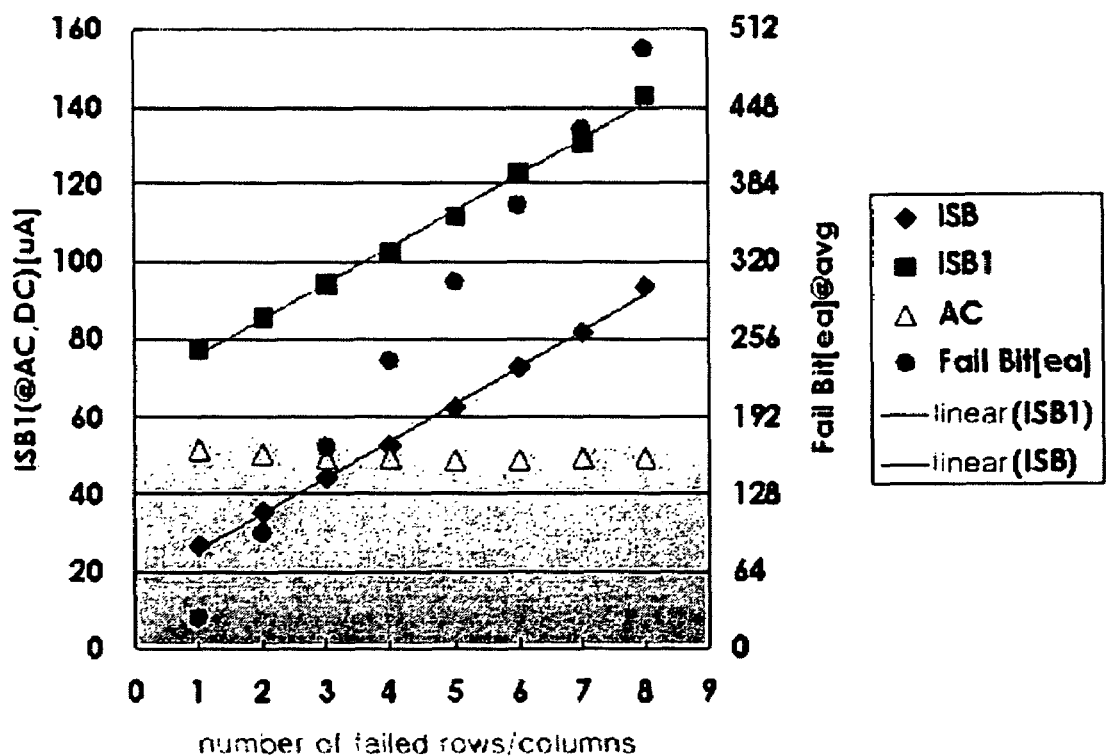
FIG. 2 is a graph illustrating the amount of leakage current generated due to failures in rows/columns caused by a bridge between a word line and a bit line.
Figure 3:
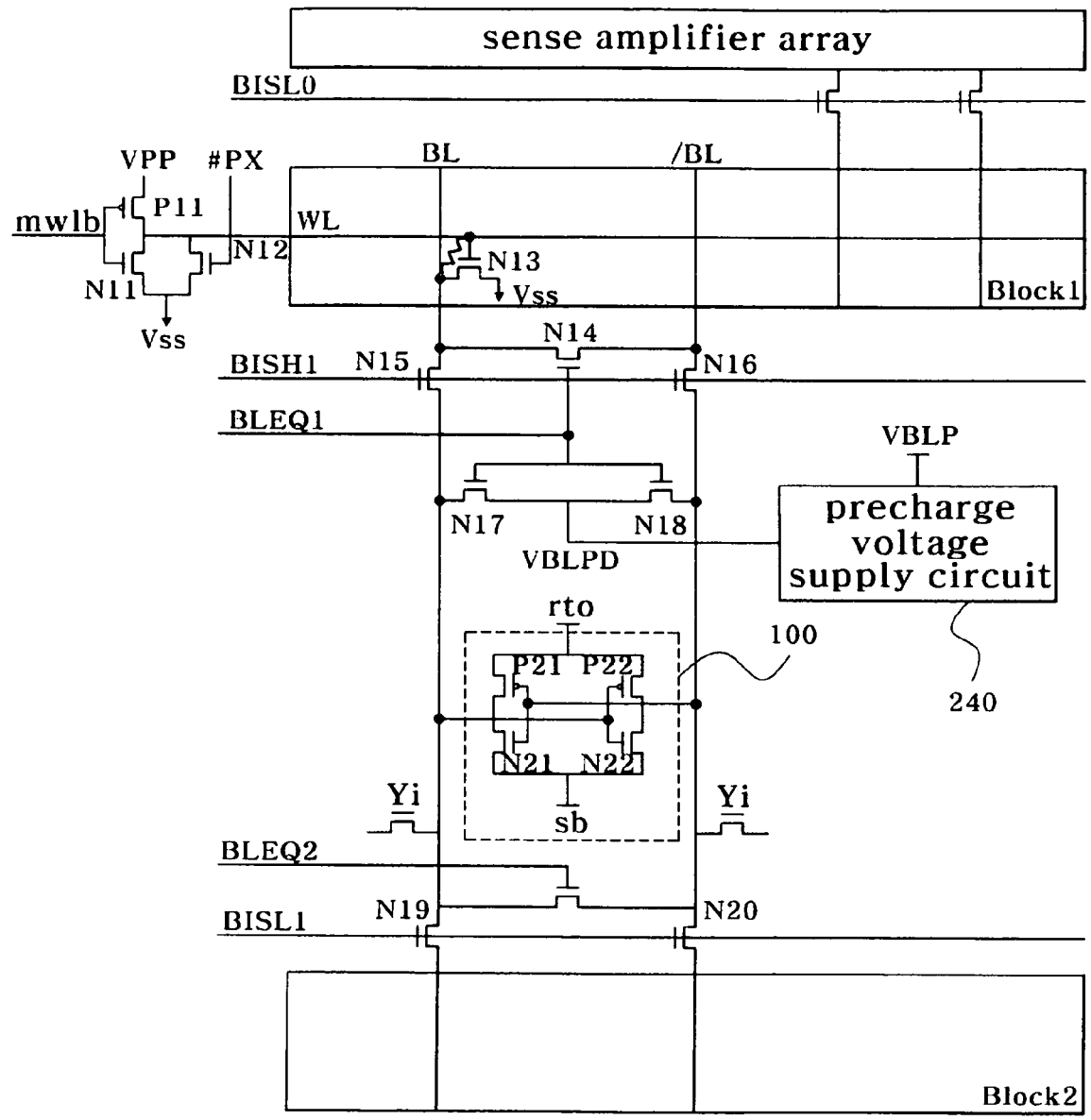
FIG. 3 is a circuit diagram showing the structure of a memory cell area in a semiconductor device according to an embodiment of the present invention.
Figure 4:
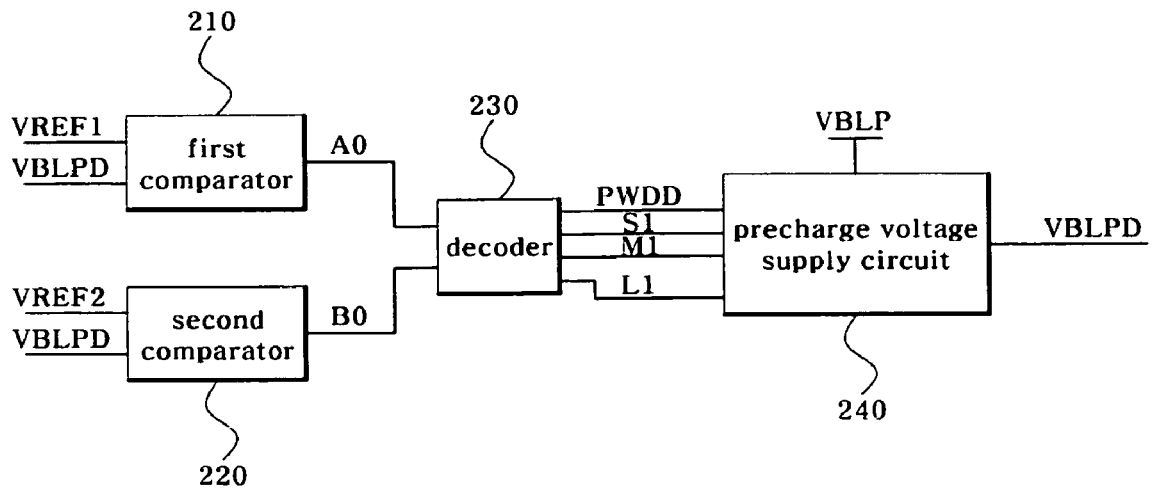
FIG. 4 is a block diagram showing the configuration of the semiconductor device according to the embodiment of FIG. 3.
Figure 5:
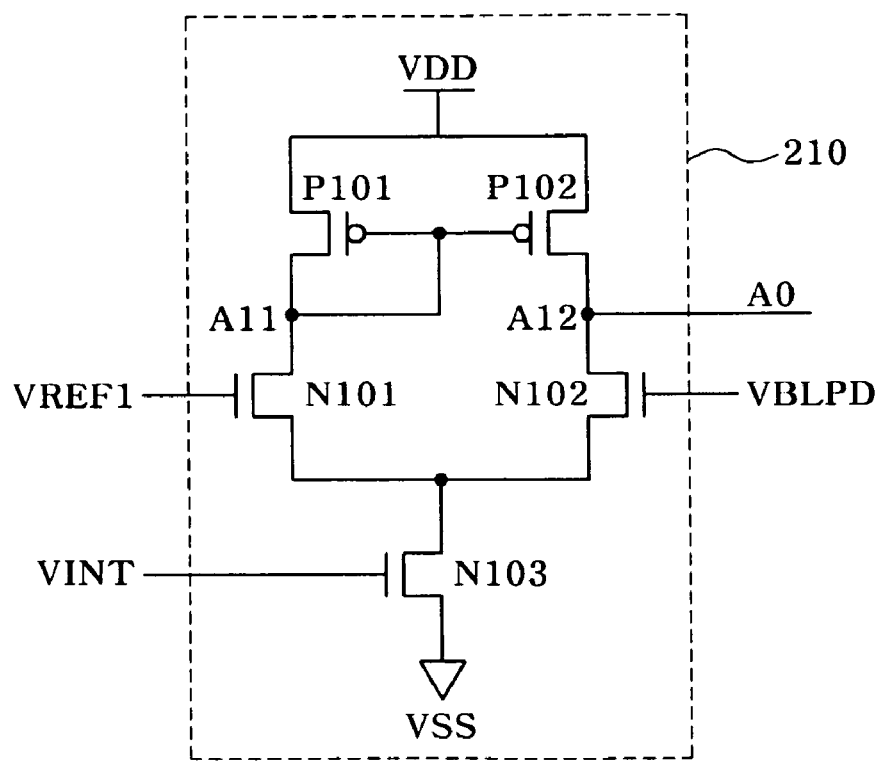
FIG. 5 is a detailed circuit diagram of a first comparator in FIG. 4.
Figure 6:
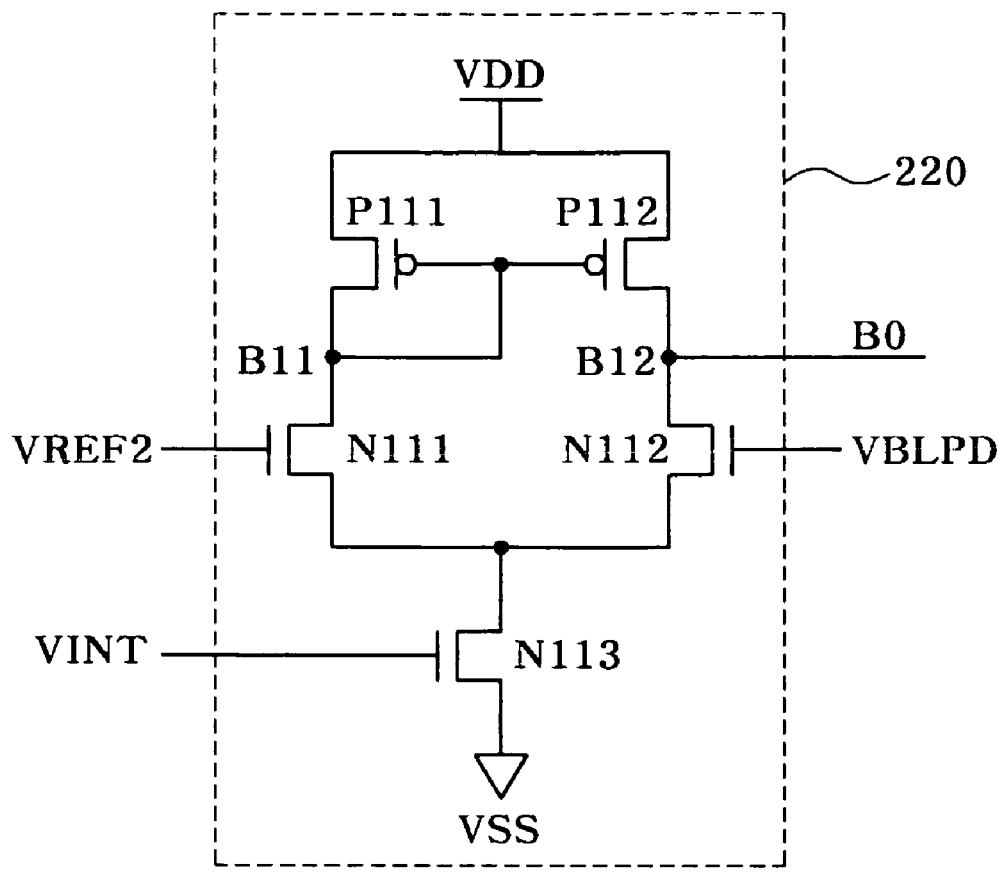
FIG. 6 is a detailed circuit diagram of a second comparator in FIG. 4.
Figure 7:
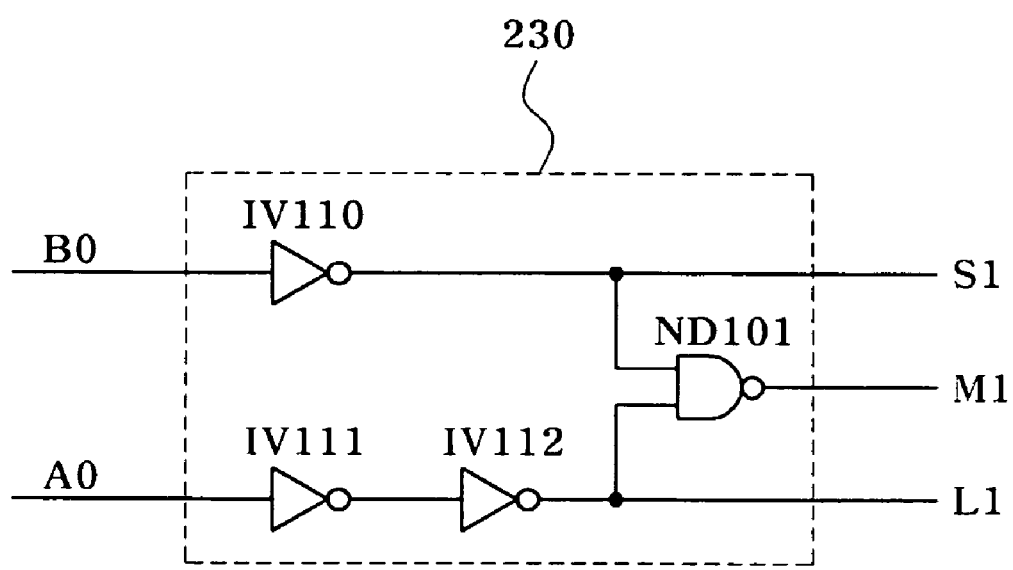
FIG. 7 is a detailed circuit diagram of a decoder in FIG. 4.
Figure 8:
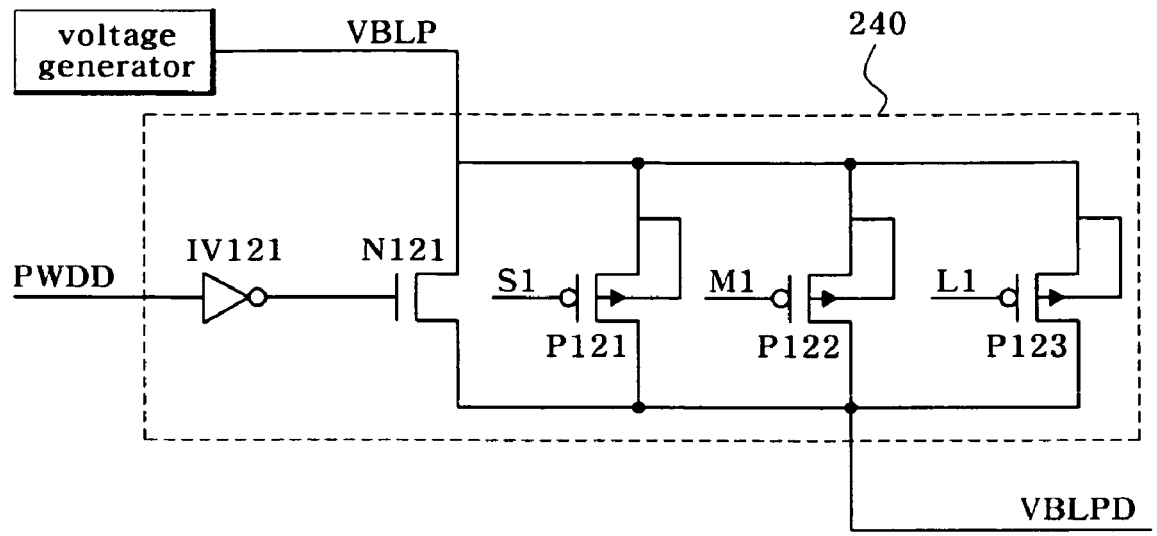
FIG. 8 is a detailed circuit diagram of a precharge voltage supply circuit in FIG. 4.

FIG. 3 shows the structure of a memory cell area in a semiconductor device according to a preferred embodiment of the present invention, FIG. 4 shows the configuration of the semiconductor device according to this embodiment, FIG. 5 shows the configuration of a first comparator in the semiconductor device according to this embodiment, FIG. 6 shows the configuration of a second comparator in the semiconductor device according to this embodiment, FIG. 7 shows the configuration of a decoder in the semiconductor device according to this embodiment, and FIG. 8 shows the configuration of a precharge voltage supply circuit in the semiconductor device according to this embodiment. Hereinafter, the subject matter of the present disclosure will be described with reference to these drawings.

As shown in FIG. 4, the semiconductor device according to the present preferred embodiment comprises a first comparator 210 for comparing a precharge voltage VBLPD with a reference voltage VREF1 of a first voltage level and outputting a compare signal A0 as a result of the comparison, a second comparator 220 for comparing the precharge voltage VBLPD with a reference voltage VREF2 of a second voltage level and outputting a compare signal B0 as a result of the comparison, a decoder 230 configured to receive and decode the compare signal A0 and the compare signal B0 and output a plurality of control signals S1, M1 and L1 as a result of the decoding, and a precharge voltage supply circuit 240 configured to receive the plurality of control signals S1, M1 and supply the precharge voltage VBLPD.

As shown in FIG. 8, the precharge voltage supply circuit 240 includes an n-channel metal oxide semiconductor (NMOS) transistor N121 for supplying the precharge voltage VBLPD to an output terminal in response to a mode control signal PWDD in a normal mode, a p-channel metal oxide semiconductor (PMOS) transistor P123 connected in parallel with the NMOS transistor N121 and turned on for supplying the precharge voltage VBLPD to the output terminal, when the precharge voltage VBLPD is higher than the reference voltage VREF1 in a power down mode, a PMOS transistor P122 connected in parallel with the NMOS transistor N121 and turned on for supplying the precharge voltage VBLPD to the output terminal, when the precharge voltage VBLPD is lower than the reference voltage VREF1 in the power down mode, and a PMOS transistor P121 connected in parallel with the NMOS transistor N121 and turned on for supplying the precharge voltage VBLPD to the output terminal, when the precharge voltage VBLPD is lower than the reference voltage VREF2 in the power down mode. Here, the PMOS transistor P123 has a turn-on resistance higher than that of the PMOS transistor P122, the PMOS transistor P121 has a turn-on resistance lower than that of the PMOS transistor P122, and the reference voltage VREF2 is lower than the reference voltage VREF1.

The operation of the present preferred embodiment with the above-stated configuration will herein after be described in detail with reference to FIGS. 3 to 8 and in conjunction with the respective operation modes of the semiconductor device, namely, the normal mode and the power down mode. Here, the normal mode includes an active mode in which actual operations of the semiconductor device including a data input operation, a data output operation, etc., are performed, a precharge mode in which a bit line and a complementary bit line are precharged to a predetermined voltage, particularly, a voltage VBLP corresponding to ½ of a core voltage VCORE, after completion of the active mode, and so forth. The power down mode refers to a low power consumption mode that the semiconductor device enters subsequently to the precharge mode.

First, a description will be given of an operation in a case where the semiconductor device is in the normal mode.

Referring to FIG. 3, at the time that the semiconductor device enters the active mode, a signal mwlb makes a high to low level transition and a signal #PX also makes a high to low level transition. Accordingly, a PMOS transistor P11 is turned on, where as NMOS transistors N11 and N12 are turned off, thereby causing a word line WL of a block block1 to be driven with a high voltage VPP level. A signal BLEQ1 also makes a high to low level transition. As a result, NMOS transistors N14, N17 and N18 are turned off, so that a bit line BL and a complementary bit line/BL are electrically isolated from each other.

On the other hand, NMOS transistors N15 and N16 are turned on because a signal BISH1 is maintained at a high level, where as NMOS transistors N19 and N20 are turned off because a signal BISL1 goes low in level. As a result, a sense amplifier 100 can sense and amplify data from an NMOS transistor N13 which is a cell transistor, or can input data to the cell transistor N13.

Then, an operation in the precharge mode is performed as follows. At the time that the semiconductor device enters the precharge mode after completing the active mode, the signal mwlb makes a low to high level transition and the signal #PX also makes a low to high level transition. Thus, the PMOS transistor P1 is turned off, where as the NMOS transistors N11 and N12 are turned on, so that the word line WL of the block block1 is driven with a ground voltage VSS level. Because the signal BLEQ1 also makes a low to high level transition, the NMOS transistors N14, N17 and N18 are turned on. As a result, the bit line BL and complementary bit line/BL are precharged with the precharge voltage VBLPD supplied from the precharge voltage supply circuit 240. At this time, the signal BISH1 remains high in level and the signal BISL1 goes high in level, thus turning on the NMOS transistors N19 and N20. Consequently, a precharge operation can be normally performed for the bit line BL and complementary bit line/BL.

In the normal mode as described above, the NMOS transistor N121 in the precharge voltage supply circuit 240 shown in FIG. 8 switches an internal voltage VBLP supplied from a voltage generator in response to an inversion-buffered version of the mode control signal PWDD to supply the precharge voltage VBLPD to the output terminal. At this time, the turn-on resistance of the NMOS transistor N121, which is a resistance when the NMOS transistor N121 is turned on, is very low, so that the internal voltage VBLP is supplied as the precharge voltage VBLPD without a significant voltage drop through the NMOS transistor N121. Here, the mode control signal PWDD assumes a low level in the normal mode and a high level in the power down mode, and the NMOS transistor N121 is turned on in response to an output signal from an inverter IV121. Meanwhile, in the precharge voltage supply circuit 240, the turn-on resistance of the PMOS transistor P123 is set to be relatively very high, the turn-on resistance of the PMOS transistor P122 is set to be lower than that of the PMOS transistor P123, and the turn-on resistance of the PMOS transistor P121 is set to be lower than that of the PMOS transistor P122.

On the other hand, in the normal mode, the precharge voltage VBLPD is on the order of 0.75V, which is higher than a predetermined voltage (for example, 0.6V). As a result, only the control signal L1, among the control signals S1, M1 and L1, is enabled to a low level, so that only the PMOS transistor P123 is turned on, which will herein after be described in detail.

When an internal voltage VINT is supplied in the normal mode, an NMOS transistor N103 in FIG. 5 and an NMOS transistor N113 in FIG. 6 are turned on, so that the first comparator 210 and the second comparator 220 are enabled. Notably, because the precharge voltage VBLPD is on the order of 0.75V in the normal mode, it is higher than the reference voltage VREF1 (set to 0.6V in the present preferred embodiment although it may be set to different values according to different embodiments) in the first comparator 210 of FIG. 5. As a result, an NMOS transistor N102 is turned on, so that a node A12 is driven with a low level. Consequently, the compare signal A0 assumes a low level. Similarly, in the second comparator 220 of FIG. 6, the precharge voltage VBLPD is higher than the reference voltage VREF2 (set to 0.5V in the present preferred embodiment although it may be set to different values according to different embodiments). Accordingly, an NMOS transistor N112 is turned on, so that a node B12 is driven with a low level. Consequently, the compare signal B0 assumes a low level, too.

In the decoder 230 of FIG. 7, a buffer, which is comprised of an inverter IV111 and an inverter IV112, buffers the compare signal A0 to output the control signal L1 of a low level, and an inverter IV110 inversion-buffers the compare signal B0 to output the control signal S1 of a high level. Also, a NAND gate ND101 performs a NAND operation with respect to the control signal L1 and the control signal S1 to output the control signal M1 of a high level.

Accordingly, in the precharge voltage supply circuit 240 of FIG. 8, the PMOS transistor P123 is turned on and the PMOS transistor P121 and PMOS transistor P122 are turned off. Consequently, in the normal mode, only the NMOS transistor N121 and PMOS transistor P123 in the precharge voltage supply circuit 240 are turned on at the same time. Because the turn-on resistance of the NMOS transistor N121 is very low, the precharge voltage supply circuit 240 can supply the precharge voltage VBLPD of a relatively high level.

Next, a description will be given of an operation in the case where the semiconductor device is in the power down mode. At the time that the semiconductor device enters from the normal mode to the power down mode, the mode control signal PWDD goes high in level. As a result, the NMOS transistor N121 in the precharge voltage supply circuit 240 shown in FIG. 8 is turned off in response to the inversion-buffered version of the mode control signal PWDD. However, even though the semiconductor device enters the power down mode, the precharge voltage VBLPD still remains higher than 0.6V. Accordingly, the control signal L1 is maintained at a low level, so that the PMOS transistor P123 is kept turned on. Also, where a resistance in a bridge formed between a word line and a bit line in the semiconductor device is relatively high, the amount of leakage current is not large, so that the precharge voltage VBLPD does not significantly fall. Consequently, the above-described state is continuously maintained.

Therefore, according to the present preferred embodiment, in the case where the resistance in the bridge is relatively high, only the PMOS transistor P123 with the very high turn-on resistance is turned on, thereby making it possible to suppress generation of logically erroneous bits, as well as to reduce the amount of leakage current flowing through a region where the bridge is formed.

On the other hand, where the resistance in the bridge formed between the word line and the bit line in the semiconductor device is lower than that in the above-stated case, the amount of leakage current is large, so that the precharge voltage VBLPD falls. In this case, the present preferred embodiment operates as follows.

At the time that the precharge voltage VBLPD becomes lower than a predetermined voltage (for example, 0.6V) under the condition that, as the semiconductor device enters the power down mode, the NMOS transistor N121 is turned off and only the PMOS transistor P123 is turned on, only the control signal M1, among the control signals S1, M1 and L1, is enabled to a low level, so that only the PMOS transistor P122 is turned on. In detail, in FIG. 5, when the precharge voltage VBLPD becomes lower than the reference voltage VREF1 of 0.6V, an NMOS transistor N101 is turned on, thereby causing a node A11 to be driven with a low level. As a result, a PMOS transistor P102 is turned on, so that the node A12 is driven with a high level, thereby causing the compare signal A0 to go high in level. However, the precharge voltage VBLPD is higher than the reference voltage VREF2 of 0.5V as before. For this reason, in FIG. 6, the NMOS transistor N112 is kept turned on and the compare signal B0 also remains low in level.

In the decoder 230 of FIG. 7, the buffer consisting of the inverter IV111 and the inverter IV112 buffers the compare signal A0 to output the control signal L1 of a high level, and the inverter IV110 inversion-buffers the compare signal B0 to output the control signal S1 of a high level. Also, the NAND gate ND101 performs a NAND operation with respect to the control signal L1 and the control signal S1 to output the control signal M1 of a low level.

Accordingly, in the precharge voltage supply circuit 240 of FIG. 8, the PMOS transistor P122 is turned on and the PMOS transistor P121 and PMOS transistor P123 are turned off. Consequently, in the power down mode, only the PMOS transistor P122 in the precharge voltage supply circuit 240 is turned on when the precharge voltage VBLPD is lower than the first reference voltage VREF1 and higher than the second reference voltage VREF2.

Notably, the turn-on resistance of the PMOS transistor P122 is lower than that of the PMOS transistor P123. Therefore, according to the present preferred embodiment, even when the precharge voltage VBLPD falls due to a large amount of leakage current resulting from a relatively low resistance in the bridge between the word line and the bit line after the semiconductor device enters the power down mode, the precharge voltage VBLPD does not continuously fall, but can be maintained at a constant level, by turning on the PMOS transistor P122 with the relatively low turn-on resistance rather than the PMOS transistor P123 and employing a voltage division between the resistance in the bridge and the turn-on resistance of the PMOS transistor P122. Thus, it is possible to suppress generation of logically erroneous bits resulting from excessive falling of the precharge voltage VBLPD.

On the other hand, where the resistance in the bridge formed between the word line and the bit line in the semiconductor device is lower than those in the above-described cases, the amount of leakage current is still larger, so that the precharge voltage VBLPD falls to a still lower level. In this case, the present preferred embodiment operates as follows.

At the time that the precharge voltage VBLPD becomes lower than a predetermined voltage (for example, 0.5V) under the condition that only the PMOS transistor P122 is turned on in the power down mode, only the control signal S1, among the control signals S1, M1 and L1, is enabled to a low level, so that only the PMOS transistor P121 is turned on. In detail, in FIG. 5, when the precharge voltage VBLPD becomes lower than even the reference voltage VREF2 of 0.5V, the compare signal A0 is maintained at a high level. In the second comparator 220 of FIG. 6, an NMOS transistor N1121 is turned on, thereby causing a node B11 to be driven with a low level. As a result, a PMOS transistor P112 is turned on, so that the node B12 is driven with a high level, thereby causing the compare signal B0 to go high in level.

In the decoder 230 of FIG. 7, the buffer consisting of the inverter IV111 and the inverter IV112 buffers the compare signal A0 to output the control signal L1 of a high level, and the inverter IV110 inversion-buffers the compare signal B0 to output the control signal S1 of a low level. Also, the NAND gate ND101 performs a NAND operation with respect to the control signal L1 and the control signal S1 to output the control signal M1 of a high level.

Accordingly, in the precharge voltage supply circuit 240 of FIG. 8, the PMOS transistor P121 is turned on and the PMOS transistor P122 and PMOS transistor P123 are turned off. Consequently, in the power down mode, only the PMOS transistor P121 in the precharge voltage supply circuit 240 is turned on when the precharge voltage VBLPD is lower than even the second reference voltage VREF2.

Notably, the turn-on resistance of the PMOS transistor P121 is lower than even that of the PMOS transistor P122. Therefore, according to the present preferred embodiment, even when the precharge voltage VBLPD falls below the reference voltage VREF2 due to a still larger amount of leakage current resulting from a still lower resistance in the bridge between the word line and the bit line after the semiconductor device enters the power down mode, the precharge voltage VBLPD does not fall excessively, but can be maintained at a constant level, by turning on the PMOS transistor P121 with the still lower turn-on resistance and employing a voltage division between the resistance in the bridge and the turn-on resistance of the PMOS transistor P121. Thus, it is possible to suppress generation of logically erroneous bits resulting from excessive falling of the precharge voltage VBLPD.

As apparent from the above description, in the precharge voltage supply circuit and the semiconductor device using the same according to the present preferred embodiment, when a bridge is formed between a bit line and a word line associated with a specific cell in the semiconductor device, the amount of leakage current flowing through a region where the bridge is formed can be reduced in the power down mode. In addition, in the precharge voltage supply circuit and the semiconductor device using the same according to the present embodiment, while there are various resistance values in a current path between the bit line and the word line established due to the bridge formation, a precharge voltage of a proper level can be supplied. Therefore, it is possible to suppress generation of logically erroneous bits.

Figure 9:
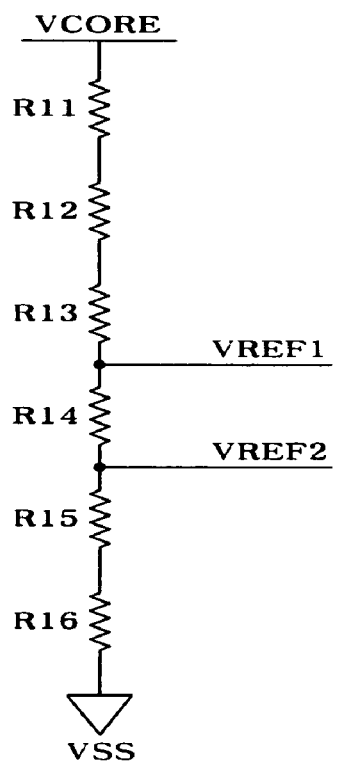
FIGS. 9 and 10 are circuit diagrams showing different embodiments of a reference voltage generator used in the semiconductor device according to the embodiment of FIG. 4.
Figure 10:
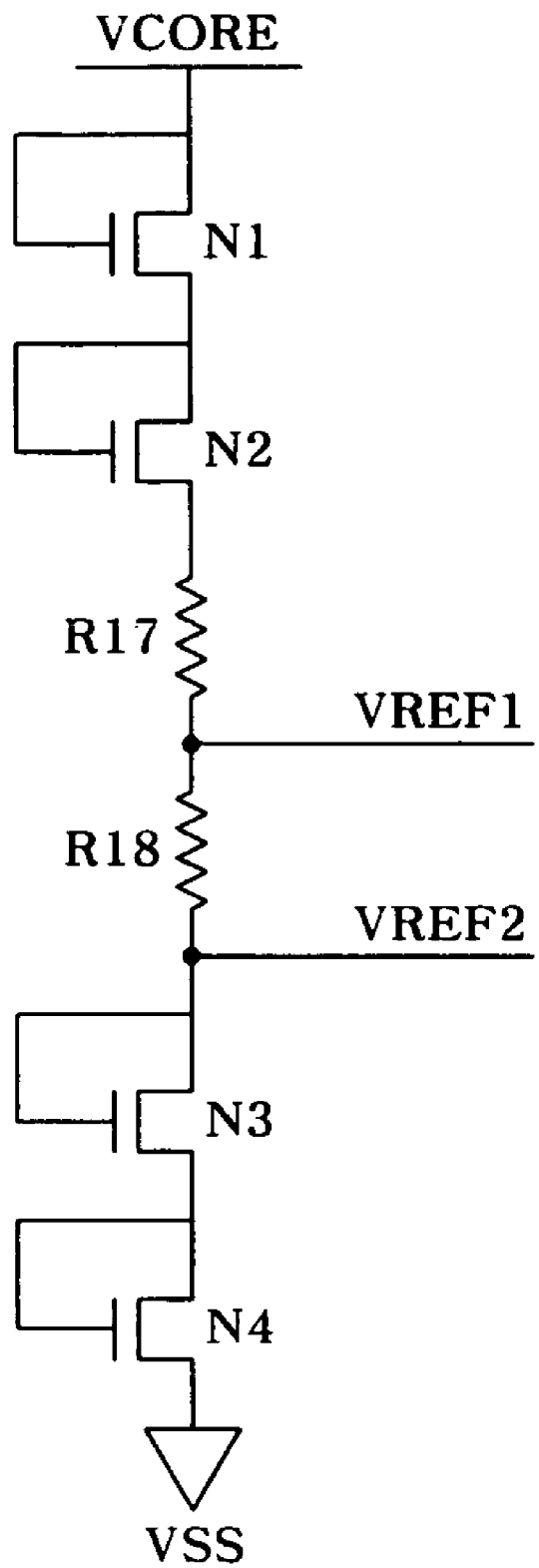

On the other hand, the reference voltage VREF1 and the reference voltage VREF2 can be generated by different embodiments of a reference voltage generator shown in FIGS. 9 and 10. As shown in FIG. 9, the reference voltage generator generates and supplies the reference voltage VREF1 and reference voltage VREF2 of the desired levels based on a voltage division of an internal voltage VCORE of a predetermined level by a plurality of resistors R11-R16 connected in series. Alternatively, as shown in FIG. 10, the reference voltage generator may generate and supply the reference voltage VREF1 and reference voltage VREF2 of the desired levels based on a voltage division of the internal voltage VCORE of the predetermined level by a plurality of resistors R17 and R18 and a plurality of MOS diodes N1-N4 connected in series.

Although the preferred embodiments of the present invention have been disclosed for illustrative purposes, those skilled in the art will appreciate that various modifications, additions and substitutions are possible, without departing from the scope and spirit of this disclosure and in the accompanying claims.

The present application claims priority to Korean patent application number 10-2006-138797, filed on Dec. 29, 2006 which is incorporated by reference herein in its entirety.

What is claimed is:

1. A precharge voltage supply circuit comprising:
a first switch for supplying a precharge voltage to an output terminal in response to a mode control signal in a normal mode;
a second switch connected in parallel with the first switch, the second switch being turned on to supply the precharge voltage to the output terminal, when the precharge voltage is higher than a first predetermined voltage level in a power down mode; and
a third switch connected in parallel with the first switch, the third switch being turned on to supply the precharge voltage to the output terminal, when the precharge voltage is lower than the first predetermined voltage level in the power down mode,
wherein the second switch has a turn-on resistance higher than that of the third switch.

2. The precharge voltage supply circuit according to claim 1, wherein the precharge voltage is supplied to a bit line and a complementary bit line.

3. The precharge voltage supply circuit according to claim 1, further comprising a fourth switch connected in parallel with the first switch, the fourth switch being turned on to supply the precharge voltage to the output terminal, when the precharge voltage is lower than a second predetermined voltage level in the power down mode, the second predetermined voltage level being lower than the first predetermined voltage level,
wherein the third switch is turned off when the precharge voltage is lower than the second predetermined voltage level.

4. The precharge voltage supply circuit according to claim 3, wherein the fourth switch has a turn-on resistance lower than that of the third switch.

5. The precharge voltage supply circuit according to claim 1, wherein the mode control signal is enabled in the power down mode and disabled in the normal mode.

6. The precharge voltage supply circuit according to claim 1, wherein the second switch is operated in response to a first control signal,
wherein the first control signal is enabled depending on a result of comparison between the precharge voltage and a first reference voltage having the first predetermined voltage level.

7. The precharge voltage supply circuit according to claim 6, wherein the third switch is operated in response to a second control signal,
wherein the second control signal is enabled depending on the result of comparison between the precharge voltage and the first reference voltage.

8. The precharge voltage supply circuit according to claim 7, further comprising a fourth switch connected in parallel with the first switch, the fourth switch supplying the precharge voltage to the output terminal in response to a third control signal in the power down mode,
wherein the third control signal is enabled when the precharge voltage is lower than a second predetermined voltage level in the power down mode, the second predetermined voltage level being lower than the first predetermined voltage level.

9. The precharge voltage supply circuit according to claim 8, wherein the fourth switch has a turn-on resistance lower than that of the third switch.

10. The precharge voltage supply circuit according to claim 9, wherein the third switch is turned off when the precharge voltage is lower than the second predetermined voltage level.

11. The precharge voltage supply circuit according to claim 8, wherein the first switch is an n-channel metal oxide semiconductor (NMOS) device and the second to fourth switches are p-channel metal oxide semiconductor (PMOS) devices.

* * * * *